US006241669B1

(12) United States Patent
Furuta et al.

(10) Patent No.: US 6,241,669 B1
(45) Date of Patent: Jun. 5, 2001

(54) MRI COIL AND MRI APPARATUS

(75) Inventors: Osamu Furuta; Kazuhiko Hayaklawa, both of Tokyo (JP)

(73) Assignee: GE Yokogawa Medical Systems, Limited, Tokyo (JP)

(*) Notice: Subject to any disclaimer, the term of this patent is extended or adjusted under 35 U.S.C. 154(b) by 0 days.

(21) Appl. No.: 09/289,907

(22) Filed: Apr. 13, 1999

(30) Foreign Application Priority Data

Jun. 5, 1998 (JP) .................................................. 10-157029

(51) Int. Cl.[7] .................................................. A61B 5/055
(52) U.S. Cl. .................................................. 600/422; 324/318
(58) Field of Search .................................................. 600/421, 422; 324/318, 322, 307, 309

(56) References Cited

U.S. PATENT DOCUMENTS

| 5,261,403 | * | 11/1993 | Saito et al. | 600/422 |
| 5,351,688 | * | 10/1994 | Jones | 600/422 |
| 5,519,321 | * | 5/1996 | Hagen et al. | 600/422 |
| 5,663,646 | * | 9/1997 | Kuth et al. | 324/318 |
| 6,029,082 | * | 2/2000 | Srinivasan et al. | 600/422 |

FOREIGN PATENT DOCUMENTS

| 62-253042 | 11/1987 | (JP) . |
| 63-249551 | 10/1988 | (JP) . |
| 1-176636 | 1/1989 | (JP) . |
| 4200530 | 7/1992 | (JP) . |
| 5049617 | 3/1993 | (JP) . |
| 6047020 | 2/1994 | (JP) . |

* cited by examiner

Primary Examiner—Ruth S. Smith
(74) Attorney, Agent, or Firm—Moonray Kojima

(57) ABSTRACT

In order to mitigate the feeling of confinement experienced by a subject (patient) and improve the S/N ratio of an MRI coil when used as a head coil, there is provided an MRI coil 10 comprising a pair of opposing coils 1 and 2 whose coil surfaces face each other with an imaging space interposed, and a quadrature coil 3 which has a coil surface orthogonal to the coil surfaces of the opposing coils 1 and 2 and surrounds the imaging space. When the MRI coil 10 is used as a head coil, the quadrature coil 3 is fitted over the eyes of a subject H, and the opposing coils 1 and 2 are positioned near the ears of the subject H.

4 Claims, 4 Drawing Sheets

MRI COIL AND MRI APPARATUS

BACKGROUND OF THE INVENTION

The present invention relates to an MRI (magnetic resonance imaging) coil, and more particularly, to an MRI coil capable of mitigating feeling of confinement experienced by a subject (patient) and improving the S/N ratio when used as a head coil.

An example of a conventional MRI head coil is shown in FIG. 1.

The MRI head coil 70 has a cylindrical shape containing an imaging space therein for accommodating the head of a subject H.

The conventional MRI head coil 70 has the following problems:

(1) Since the coil has a cylindrical shape enveloping the head of the subject H and has few opening portions, visual and auditory perception of the subject H is extensively restricted and the subject's exhaled breath fills the coil, giving the subject H a confined feeling.

(2) Since the coil envelops the head of the subject H, the coil requires a cavity having a greater size than the distance from the tip of the nose to the back of the head, and the coil therefore cannot be significantly reduced in size. Thus, because the distance between the subject H and the coil cannot be reduced, the S/N ratio is lowered.

SUMMARY OF THE INVENTION

It is an object of the present invention to provide an MRI coil capable of mitigating the confined feeling experienced by a subject (patient) and improving the S/N ratio when used as a head coil.

In accordance with a first aspect of the present invention, there is provided an MRI coil comprising a pair of opposing coils whose coil surfaces face each other with an imaging space interposed, and a quadrature coil which has a coil surface orthogonal to the coil surfaces of the opposing coils and surrounds the imaging space.

When the MRI coil of the first aspect is used as a head coil, the quadrature coil is fitted over the head of the subject, and the opposing coils are positioned near the ears of the subject. In this condition, the quadrature coil overhangs the eyes of the subject, but does not cover the head top, nose or mouth. The opposing coils are placed near the ears of the subject, but do not completely cover the ears. Moreover, the exhaled breath of the subject does not fill the coil. Hence, the coil does not give the subject a confined feeling. Furthermore, since the quadrature coil does not cover the nose, the coil does not require a cavity having a greater size than the distance from the tip of the nose to the back of the subject H's head, and the coil can be reduced in size. The reduced size shortens the distance between the subject and the coil, thereby improving the S/N ratio.

In accordance with a second aspect of the present invention, there is provided the MRI coil as described regarding the first aspect, wherein the opposing coils and the quadrature coil are integrally combined so that their positions relative to one another are maintained unchanged, and part of the coil surfaces of the opposing coils are opened outward.

A coil is preferably disposed as close to the subject as possible in order to improve the S/N ratio. Accordingly, the spacing between the opposing coils is made slightly greater than the size of the subject. However, this may result in difficulties in fitting the coil over the head of the subject when the coil is used as a head coil. The MRI coil of the second aspect has part of the coil surfaces of the opposing coils opened outward, facilitating finting of the coil over the head of the subject. Moreover, since the opposing coils and the quadrature coil are integrally combined so that their relative positions remain unchanged, the coil requires no pivotal attachment mechanism, thereby simplifying the structure.

In accordance with a third aspect of the present invention, there is provided the MRI coil as described regarding the first aspect, wherein the opposing coils are pivotally attached to the quadrature coil, and the pair of opposing coils is allowed to be opened in an inverted V-like shape.

A coil is preferably disposed as close to the subject as possible in order to improve the S/N ratio. Accordingly, the spacing between the opposing coils is made slightly greater than the size of the subject. However, this may result in difficulties in fitting the coil over the head of the subject when the coil is used as a head coil. The MRI coil of the third aspect has the pair of opposing coils that is allowed to be opened in an inverted V-like shape, facilitating fitting of the coil over the head of the subject. Moreover, this eliminates the need to form part of the opposing coils in an opened shape, thereby simplifying the shape of the opposing coils.

The MRI coil of the present invention may be used as, for example, a knee coil for imaging the knee.

In accordance with a fourth aspect of the present invention, there is provided an MRI apparatus comprising static magnetic field generating means for generating a static magnetic field to be applied to a subject during image capture, wherein the MRI coil as described regarding any of the first through third aspects is employed to acquire NMR signals from the subject.

The MRI coil and MRI apparatus of the present invention can thus mitigate feeling of confinement experienced by a subject (patient) and improve the S/N ratio when the coil is used as a head coil, Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to its embodiments shown in the accompanying drawings.

First Embodiment

Figure 1:
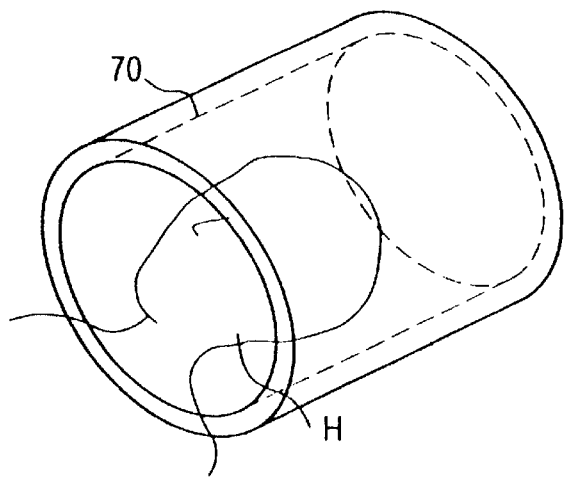
FIG. 1 is a perspective view of a conventional MRI head coil.
Figure 2A:
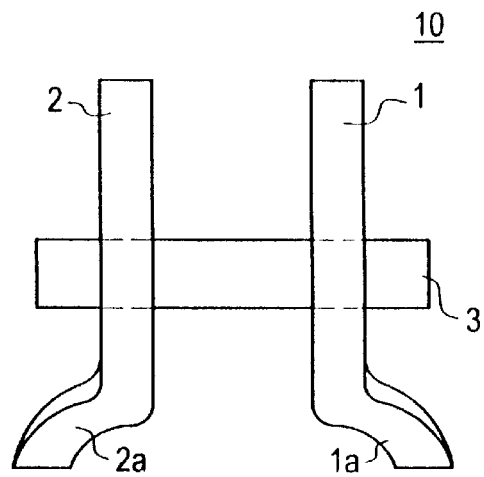
FIGS. 2A–2C are views taken from three orthogonal directions of an MRI head coil in accordance with the first embodiment of the present invention.
Figure 2B:
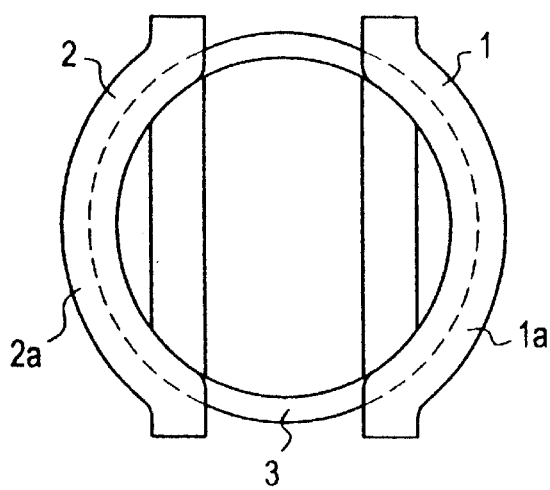
Figure 2C:
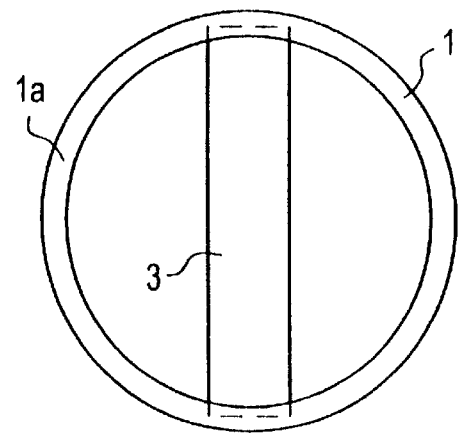

FIGS. 2A–2C are respectively a front elevational view, a right side view and a plan view of an MRI head coil in accordance with the first embodiment of the present invention.

The MRI head coil 10 comprises a pair of opposing coils 1 and 2 whose coil surfaces face each other with an imaging space interposed, and a quadrature coil 3 which has a coil surface orthogonal to the coil surfaces of the opposing coils 1 and 2 and surrounds the imaging space.

The opposing coils 1 and 2 have a generally circularly annular shape as a whole, except that their respective front peripheral portions 1*a* and 2*a* are opened outward.

The quadrature coil 3 has a generally track-like annular shape (i.e., an annular shape consisting of semicircles and straight lines like a race track for field sports).

The opposing coils 1 and 2 and the quadrature coil 3 are integrally combined so that their relative positions are maintained unchanged.

Figure 3:
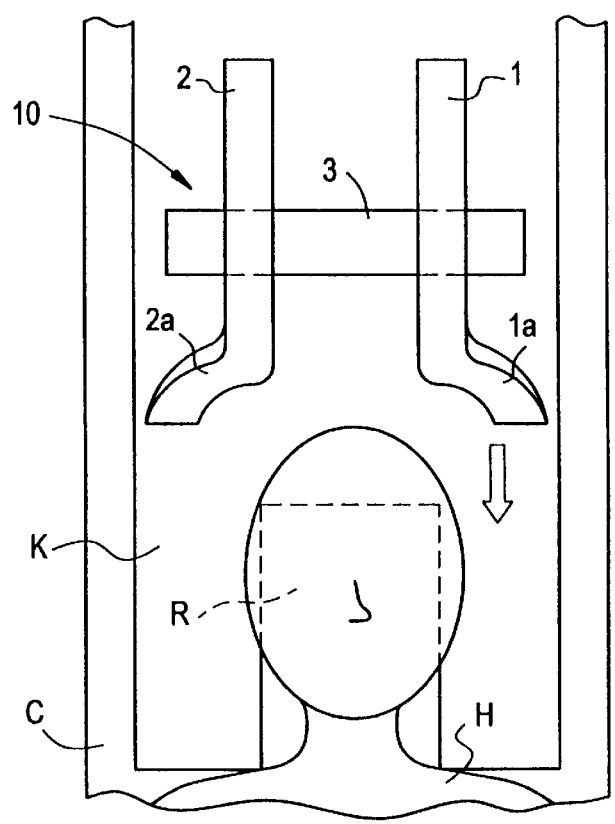
FIG. 3 illustrates the MRI head coil of FIG. 2 prior to being fitted over a subject.

FIG. 3 illustrates the MRI head coil 10 being fitted over the head of a subject.

A cradle C is provided with a head rest R for supporting the head of the subject H a certain distance above the cradle C, and a concave portion K for inserting the MRI head coil 10 below the head rest R. The MRI head coil 10 is set behind the head of the subject H.

First, the subject H is laid on the cradle C at a position such that the head of the subject H is supported by the head rest R.

The MRI head coil 10 is then slid to be fitted over the head of the subject H. That is, the MRI head coil 10 is slid to a position at which the quadrature coil 3 overhangs the eyes of the subject H.

Figure 4:
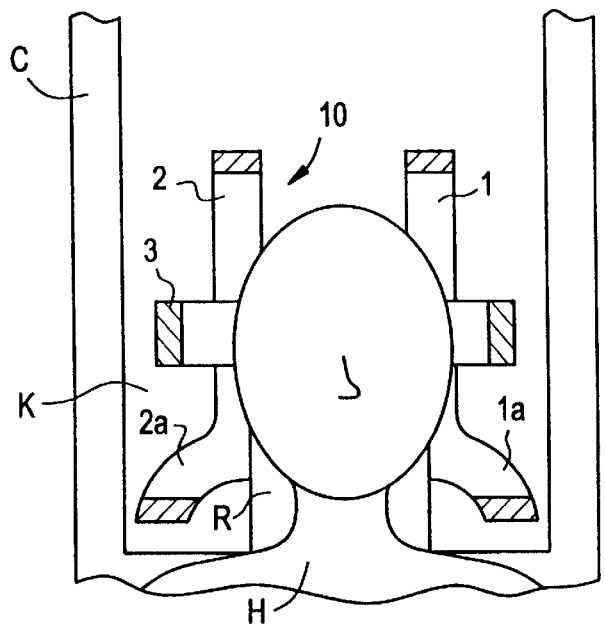
FIG. 4 illustrates the MRI head coil of FIG. 2 fitted over the subject.

FIG. 4 is a cross sectional view illustrating the MRI head coil 10 fitted over the head of the subject H.

The opposing coils 1 and 2 are electrically connected so that their currents flow in the same direction (the connection may be either serial or parallel), to constitute so-called Helmholtz coils. This generates a homogeneous magnetic field in the imaging space between the opposing coils 1 and 2.

The quadrature coil 3 is "quadrature connected" with respect to the opposing coils 1 and 2. This achieves effective reception of NMR signals.

The above-described MRI head coil 10 offers the following advantages:
(1) The quadrature coil 3 overhangs the eyes of the subject H, but does not cover the head top, nose or mouth. The opposing coils 1 and 2 are placed near the ears of the subject H, but do not completely cover the ears. Moreover, the exhaled breath of the subject H does not fill the coil. Hence, the coil does not give the subject H a confined feeling.
(2) Since the quadrature coil 3 does not cover the nose, the coil does not require a cavity having a greater size than the distance from the tip of the nose to the back of the subject H's head, and the coil may be reduced in size. The reduced size shortens the distance between the subject H and the coil, thereby improving the S/N ratio.
(3) Since the front peripheral portions 1*a* and 2*a* of the opposing coils 1 and 2 are opened outward, the coil is easy to fit over the head of the subject H.
(4) Since the opposing coils 1 and 2 and the quadrature coil 3 are integrally combined so that their relative positions are maintained unchanged, the coil requires no pivotal attachment mechanism, thereby simplifying the structure.

Second Embodiment

Figure 5A:
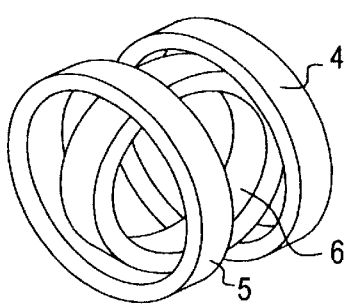
FIG. 5 is a perspective view of an MRI head coil in accordance with the second embodiment of the present invention.
Figure 5B:
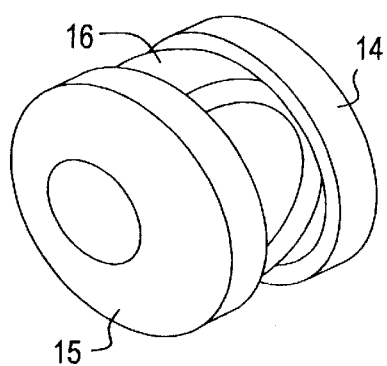
Figure 5C:
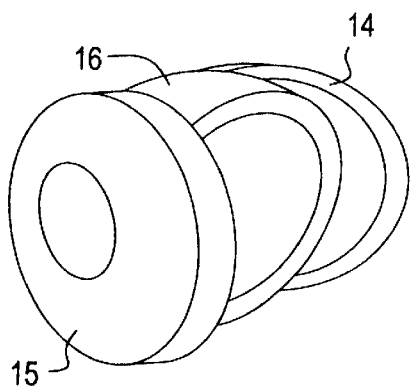

FIG. 5 (*a*) is a perspective view of coils in an MRI head coil in accordance with the second embodiment of the present invention.

The MRI head coil 20 comprises a pair of opposing coils 4 and 5 whose coil surfaces face each other with an imaging space interposed, and a quadrature coil 6 which has a coil surface orthogonal to the coil surfaces of the opposing coils 4 and 5 and surrounds the imaging space.

The opposing coils 4 and 5 have a generally circularly annular shape.

The quadrature coil 6 has a generally track-like annular shape.

The opposing coils 4 and 5 and the quadrature coil 6 are integrally combined by means of covers 14–16 as will be described hereinafter.

FIG. 5(*b*) is a perspective view of the covers for the MRI head coil 20.

The opposing coil 4 is contained in a left cover 14. The opposing coil 5 is contained in a right cover 15. The quadrature coil 6 is contained in a central cover 16.

The left and right covers 14 and 15 are pivotally attached to the central cover via hinges, and are allowed to be opened in an inverted V-like shape. That is, the opposing coils 4 and 5 are allowed to be opened in an inverted V-like shape.

FIG. 5(*c*) is a perspective view of the MRI head coil 20 with its covers 14 and 15 opened.

While the opposing coils 4 and 5 shown in FIG. 5(*c*) are opened in an inverted V-like shape in the horizontal direction, the opposing coils can instead be configured to be opened in a V-like shape in the upward or downward direction.

The above-described MRI head coil 20 offers the following advantages:
(1) Since the coil has a large opening portion, the coil intercepts only a small portion of the field of view of the subject H and is not filled with the exhaled breath of the subject H, thereby giving the subject H no feeling of confinement.
(2) Since the quadrature coil 6 does not cover the nose, the coil does not require a cavity having a greater size than the distance from the tip of the nose to the back of the subject H's head, and the coil can be reduced in size. The reduced size shortens the distance between the subject H and the coil, thereby improving the S/N ratio.
(3) Since the opposing coils 4 and 5 are opened in an inverted V-like shape, the coil is easy to fit over the head of the subject H.
(4) The opposing coils 4 and 5 can have a simple shape.

Third Embodiment illustrates the configuration of a vertical magnet MRI apparatus employing the MRI head coil of the present invention.

The vertical magnet MRI apparatus 100 comprises a vertical magnet apparatus 30, a movable chair 40 and a movable table (not shown).

The vertical magnet apparatus 30 has a vertical opposing magnet 31 whose opposing surface is vertically disposed, another vertical opposing magnet 32 (not shown) which is disposed opposite to the magnet 31, a rail 33 (34) provided on the opposing surface of the vertical opposing magnet 31 (32), a table stopper apparatus (not shown) and a chair stopper apparatus 35.

The rail 33 (34) is provided for supporting the cradle coming out of the movable table.

The table stopper apparatus and the chair stopper apparatus 35 are provided with connectors for establishing electrical connection with the movable table or the movable chair 40.

The movable chair 40 has a supporting panel 41 for supporting the MRI head coil 10 slidably in the vertical direction.

Figure 6:
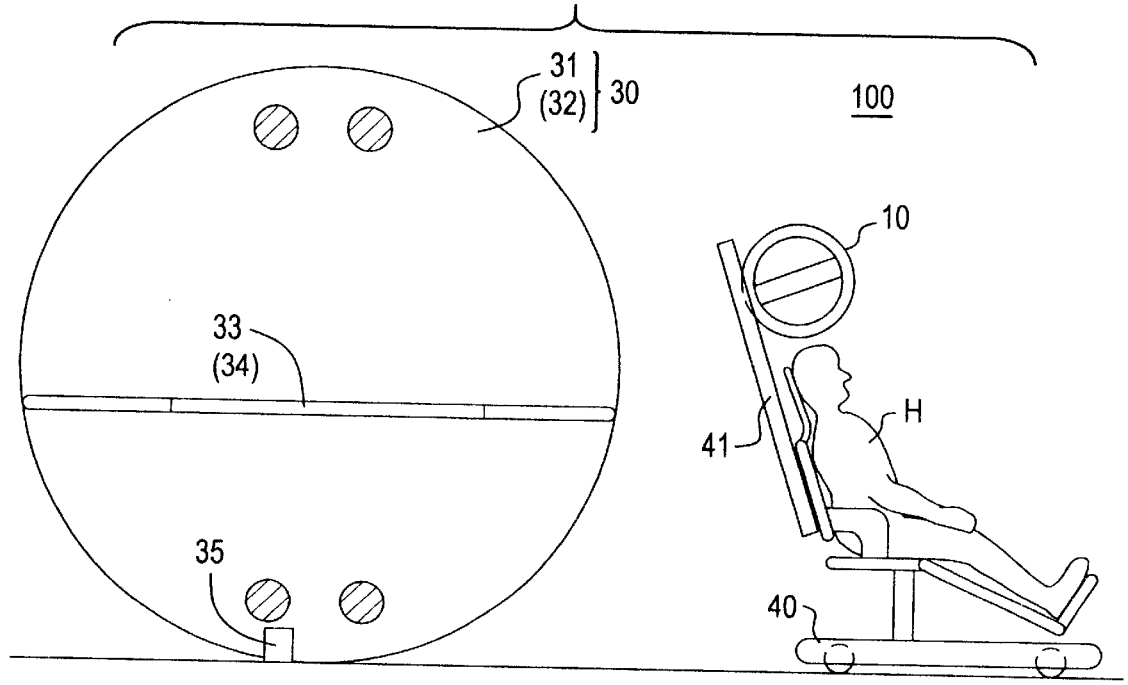
FIG. 6 illustrates the configuration of a vertical magnet MRI apparatus in accordance with the third embodiment of the present invention.
Figure 7:
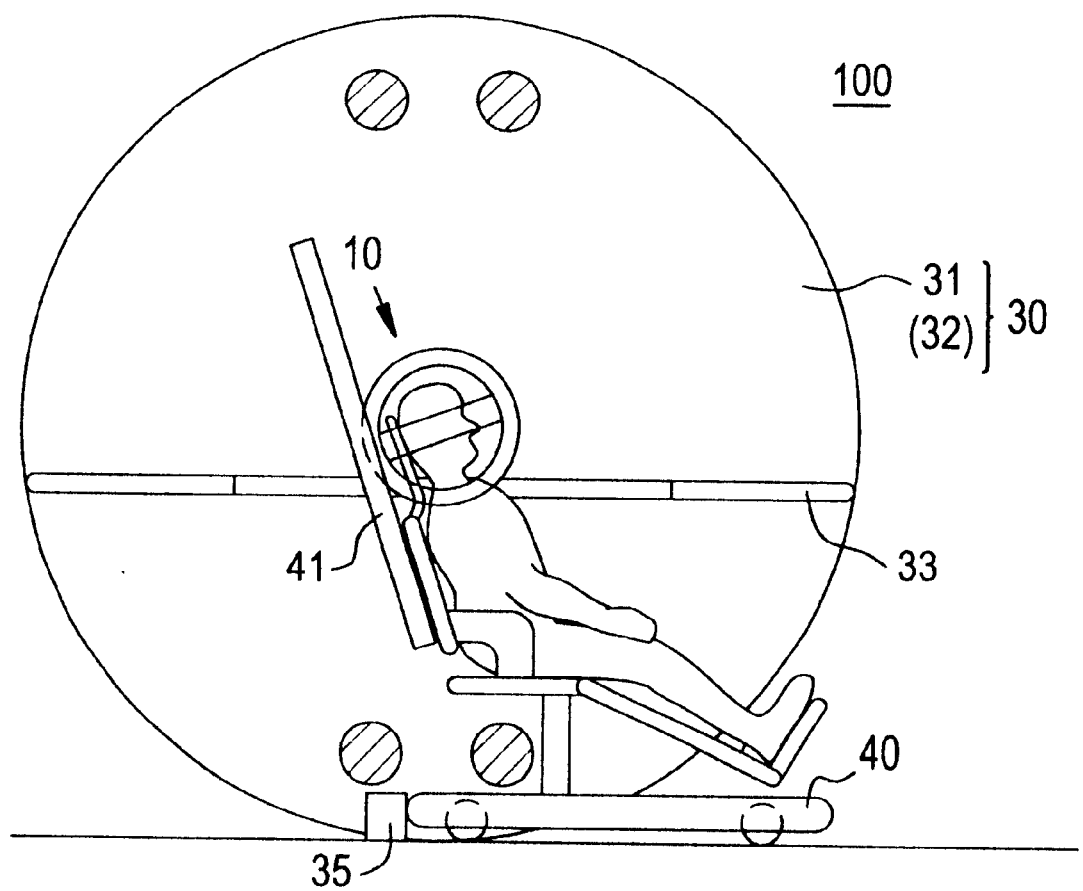
FIG. 7 illustrates imaging of the head in the vertical magnet MRI apparatus of FIG. 6.

In imaging operation, the subject H is seated on the movable chair 40 with the movable chair 40 drawn out of the vertical magnet apparatus 30 as shown in FIG. 6. At this time, the MRI head coil 10 is raised. Then the MRI head coil 10 is lowered to be fitted over the head of the subject H. Subsequently the movable chair 40 is moved into the space between the opposing surfaces of the vertical magnet apparatus 30 as shown in FIG. 7. Thereafter, the imaging is performed.

The above-described vertical magnet MRI apparatus 100 allows imaging of the head to be easily done with a subject seated on a chair.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging coil for use on a head of a subject being diagnosed, said imaging coil comprising:

a pair of similar coils disposed substantially parallel to and opposite each other, and having coil surfaces facing each other with an imaging space interposed therebetween and in which imaging space said head is positioned for diagnosis, each of said pair of similar coils having a closed circular shape, as seen from a plan view, with a part thereof being planar and another part thereof being non-planar, as seen from a side view, so that said non-planar part of each of said pair of similar coils is located outside of a plane on which said planar part is located, and a non-planar part of one similar coil is disposed to be opposite a non-planar part of the other similar coil to thereby form an opening therebetween which is larger than the distance between the parallely located planar parts of said pair of similar coils; and an orthogonal coil having a coil surface which is disposed to be orthogonal to said coil surfaces of said pair of similar coils and surrounding said imaging space;

wherein a combination of said two similar coils and said orthogonal coil is positioned for imaging by fitting said combination about a top of said head through an opening created by said oppositely positioned non-planar parts of said pair of similar coils so that said head is placed in said imaging space with said pair of similar coils fitted on the sides of said head where ears thereof are located, and said orthogonal coil is fitted over a face of said head and overhanging eyes of said head without covering the head top, nose or mouth, and so that said pair of similar coils are placed near and only partially covering said ears of said head, whereby the entire structure of said imaging coil is reduced in size to thereby improve signal to noise ratio and whereby the entire structure is easy to fit over said head and does not cause a claustrophobic reaction of the subject being imaged.

2. The coil of claim 1, wherein said pair of similar coils and said orthogonal coil are integrally combined so that relative position therebetween is maintained substantially the same.

3. The coil of claim 1, wherein said pair of similar coils are positioned so that the non-planar parts thereof form a V with the opening in the V being away from the planar parts of said pair of similar coils.

4. A magnetic resonance imaging apparatus comprising:

means for generating a static magnetic field;

means for applying said static magnetic field to a head of a subject during image capture; and a magnetic imaging coil for use on said head, said imaging coil comprising:

a pair of similar coils disposed substantially parallel to and opposite each other, and having coil surfaces facing each other with an imaging space interposed therebetween and in which imaging space said head is positioned for diagnosis, each of said pair of similar coils having a closed circular shape, as seen from a plan view, with a part thereof being planar and another part thereof being non-planar, as seen from a side view, so that said non-planar part of each of said pair of similar coils is located outside of a plane on which said planar part is located, and a non-planar part of one similar coil is disposed to be opposite a non-planar part of the other similar coil to thereby form an opening therebetween which is larger than the distance between the parallely located planar parts of said pair of similar coils; and an orthogonal coil having a coil surface which is disposed to be orthogonal to said coil surfaces of said pair of similar coils and surrounding said imaging space;

wherein a combination of said two similar coils and said orthogonal coil is positioned for imaging by fitting said combination about a top of said head and through an opening created by said oppositely positioned non-planar parts of said pair of similar coils so that said head is placed in said imaging space with said pair of similar coils fitted on the sides of said head where ears thereof are located, and said orthogonal coil is fitted over a face of said head and overhanging eyes of said head without covering the head top, nose or mouth, and so that said pair of similar coils are placed near and only partially covering said ears of said head.

* * * * *